(12) United States Patent
Betz et al.

(10) Patent No.: US 6,957,412 B1
(45) Date of Patent: Oct. 18, 2005

(54) TECHNIQUES FOR IDENTIFYING FUNCTIONAL BLOCKS IN A DESIGN THAT MATCH A TEMPLATE AND COMBINING THE FUNCTIONAL BLOCKS INTO FEWER PROGRAMMABLE CIRCUIT ELEMENTS

(75) Inventors: Vaughn Betz, Toronto (CA); Elias Ahmed, Toronto (CA); David Neto, Toronto (CA)

(73) Assignee: Altera Corporation, San Jose, CA (US)

( * ) Notice: Subject to any disclaimer, the term of this patent is extended or adjusted under 35 U.S.C. 154(b) by 342 days.

(21) Appl. No.: 10/298,259

(22) Filed: Nov. 15, 2002

(51) Int. Cl.$^7$ .............................................. G06F 17/50
(52) U.S. Cl. ................................ 716/16; 716/2; 716/4
(58) Field of Search ................. 716/16, 2, 4; 326/41

(56) References Cited

U.S. PATENT DOCUMENTS 6,727,726 B1 * 4/2004 Plants ........................ 326/41
6,829,756 B1 * 12/2004 Trimberger .................... 716/6

OTHER PUBLICATIONS

Wen-Jong Fang et al., Multiway FPGA Partitioning by Fully Exploiting Design Hierarchy, ACM Transactions of Design Automation of Electronic Systems, pp. 34-50, Jan. 2000.*
E. Bozorgzadeh et al., RPACK: Routability-Driven Packing for Cluster-based FPGAs, Proceedings of the 2001 Conference on Asia South Pacific Design Automation, pp. 629-634, Jan. 2001.*
Wen-Jong Fang et al., Performance-Drive Multi-FPGA Partitioning Using Functional Clustering and Replication, Proceedings of the 35th Annual Conference on Design Automation. pp. 283-386, May 1998.*
A. Marquardt et al., Using Cluster-Based Logic Blocks and Timing-Driven Packing to Improve FPGA Speed and Density, Proceedings of the 1999 ACM/SIGDA Seventh International Symposium on Field Programmable Gate Arrays, pp. 37-46, Feb. 1999.*
Betz, V. et al. (1999). *Architecture and CAD for Deep-Submicron FPGAs, Chapters 1-3, Kluwer Academic Publishers*, Norwell, Massachusetts, 63 pages total.
Fang et al., "Performance-Driven Multi-FPGA Partitioning Using Functional Clustering and Replication", DAC 98.
Marquardt et al., "Using Cluster-Based Logic Blocks and Timing-Driven Packing to Improve FPGA Speed and Density", FPGA 99.
Fang et al., "Multiway FPGA Partitioning by Fully Exploiting Design Hierarchy", ACM Transactions on Design Automation of Electronic Systems, vol. 5, No. 1, Jan. 2000.
Bozorgzadeh et al., "RPack: Routability-Driven packing for cluster-based FPGAs", IEEE 2001.

* cited by examiner

*Primary Examiner*—A. M. Thompson
(74) *Attorney, Agent, or Firm*—Townsend and Townsend and Crew LLP (57) ABSTRACT

Techniques are provided that combine functional blocks in a user design into fewer programmable circuit elements. Systems and methods of the present invention can combine functional blocks in a user design into a single programmable circuit element. A plurality of functional blocks in a user design that can be combined are identified. The possible combinations of functional blocks can be sorted according to a gain function. The gain function can, for example, weigh routing delays caused by a combination. The most desirable combination is selected from the sorted list of possible combinations. The selected combination is checked to see if it is feasible in light of electrical and user-specified constraints. If the combination is feasible, the combination is performed. Combinations continue to be performed by selecting the most desirable combinations from the sorted list.

35 Claims, 6 Drawing Sheets

TECHNIQUES FOR IDENTIFYING FUNCTIONAL BLOCKS IN A DESIGN THAT MATCH A TEMPLATE AND COMBINING THE FUNCTIONAL BLOCKS INTO FEWER PROGRAMMABLE CIRCUIT ELEMENTS

BACKGROUND OF THE INVENTION

This patent relates to techniques for reducing the number of programmable circuit elements that are programmed to implement a user design, and more particularly, to techniques for combining functional blocks into fewer programmable circuit elements.

Programmable logic devices (such as Altera's Stratix family of products) typically include rows and columns of programmable circuit elements. Programmable circuit elements are blocks of circuitry that are coupled together through routing resources such as interconnection conductors. A programmable circuit element may, for example, contain registers, a look-up table, memory circuits, multiplexers and/or other circuits. Programmable circuit elements can be programmed to perform a variety of user functions. An example of a programmable circuit element is a logic element, which usually contains a look-up table and a register and some support circuitry for arithmetic and other functions.

A programmable logic device (PLD) can be configured according to a user design by programming the logic elements, the routing resources, and any other programmable circuit elements. Often when a PLD is configured, functional blocks in the user design are programmed into more logic elements in the PLD than necessary.

For example, a user design may include functional blocks that are performed by a look-up table and a register. In the user design, the output of the look-up table is coupled to an input of the register. A look-up table coupled to an input of a register is referred to as a normal template.

When the PLD is configured, a first logic element is programmed to perform the function of the look-up table, and a second logic element coupled to the first logic element is programmed to perform the function of the register. Because each logic element includes a register and a look-up table, the register and the look-up function in the user design can be combined into one logic element in the PLD. This would reduce the number of logic elements in the PLD that are needed to configure the PLD according to the user design.

One exemplary prior art algorithm searched through user designs and identified normal templates that were programmed into more than one logic element. The algorithm then combined the register and the look-up table functions into one logic element to increase the density of the circuit design. However, this prior art algorithm did not take into consideration how timing delays in the user design would be effected by combining functional blocks.

It would therefore be desirable to provide techniques for combining functional blocks into fewer programmable circuit elements that takes into consideration changes in timing delays caused by these combinations.

BRIEF SUMMARY OF THE INVENTION

The present invention provides techniques for combining functional blocks into fewer programmable circuit elements. Systems and methods of the present invention can combine two or more functional blocks in a user design into a single programmable circuit element on a programmable integrated circuit. For example, a look-up table can be combined with a register into one logic element. Functional blocks are circuit functions that are performed by a programmable integrated circuit.

The present invention identifies two or more functional blocks in a user design that can be combined. The possible combinations of functional blocks are then sorted according to a gain function. The gain function can, for example, weigh routing delays caused by a combination. As another example, the gain function can weigh the number of nets that are absorbed by the combination.

According to the present invention, the most desirable combination is then selected from the sorted list of possible combinations. If the selected combination is feasible in light of electrical and user-specified constraints, the combination is performed. Combinations continue to be performed by selecting the most desirable combinations from the sorted list.

By performing the most desirable combinations first, routing delays in the user design are minimized and more nets are absorbed into programmable circuit elements. Other less desirable combinations can also be performed subsequent to performing the most desirable combinations.

DETAILED DESCRIPTION OF THE INVENTION

Programmable integrated circuits include programmable logic devices (PLDs), field programmable gate arrays (FP- GAs), and programmable logic arrays (PLAs). Although the present invention is primarily discussed in the context of PLDs and logic elements, it should be understood that the present invention includes other types of programmable integrated circuits such as FPGAs and PLAs.

Programmable integrated circuits include numerous programmable circuit elements such as logic elements. The present invention provides techniques for combining functional blocks in a user design into fewer programmable circuit elements. Functional blocks in a user design can be placed in unused portions of programmable circuit elements. By combining functional blocks into a smaller number of programmable circuit elements, more programmable circuit elements are available to be programmed according to other functional blocks in a user design.

Figure 1:
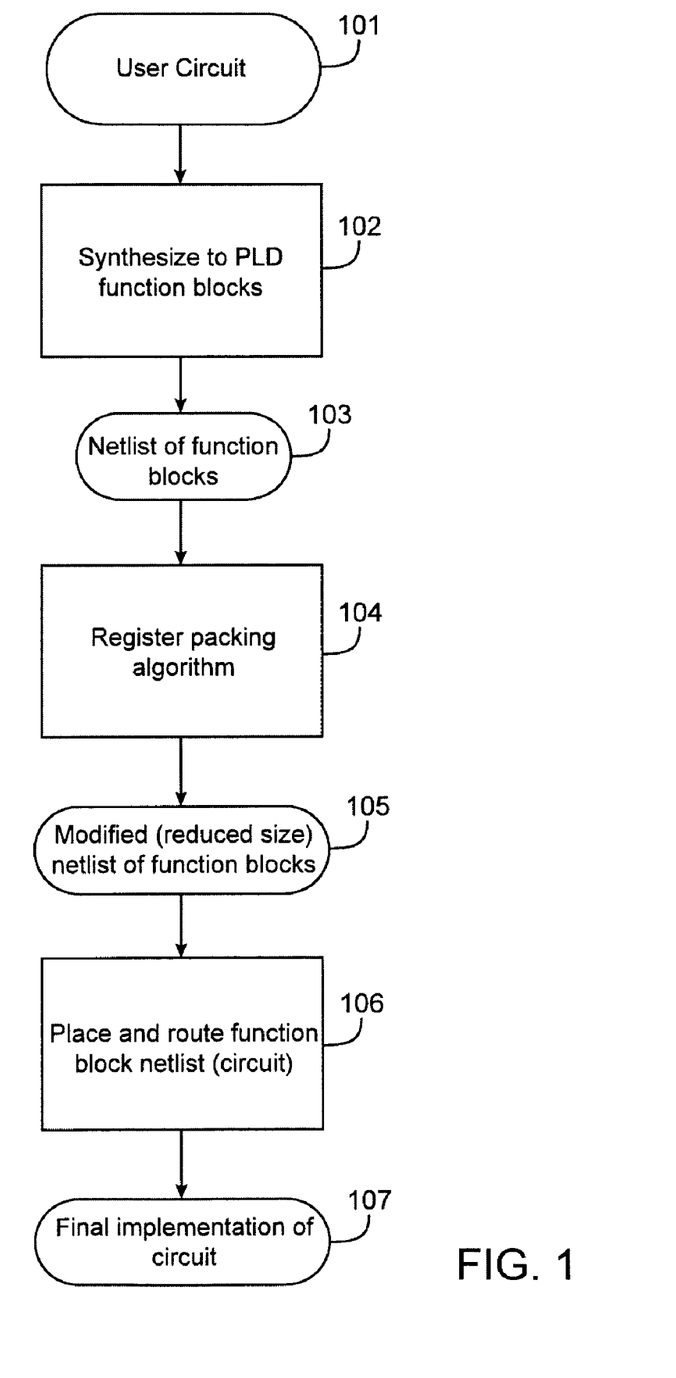
FIG. 1 is a flow chart illustrating an example of how techniques of the present invention can be integrated with a method for configuring a programmable integrated circuit according to a user design.

FIG. 1 illustrates a flow chart of the steps that may be performed by a computer-aided design (CAD) system to program a PLD according to an embodiment of the present invention. The CAD system can program a PLD according to a particular user design.

Initially, the CAD system accepts a representation of the user circuit design 101. In step 102, the CAD system synthesizes the user design into function blocks on the PLD according to techniques that are well known to those of skill in the art. The CAD system selects particular logic elements and other programmable circuit elements and routing resources on the PLD that can be programmed to implement the user design. The CAD system determines how these logic elements, other programmable circuit elements and routing resources can be programmed to implement each function in the user design.

The CAD system outputs a netlist of function blocks 103. Netlist 103 is a representation of a PLD that is configured according to the user design. Netlist 103 indicates what programmable circuit elements can be programmed and how these programmable circuit elements can be programmed to implement the user design.

Netlist 103 may indicate what information will be stored in particular memory circuits on the PLD. Netlist 103 also indicates which logic elements and other circuit elements on the PLD must be connected to implement the user design.

Once netlist 103 has been created, the present invention selects functional blocks in netlist 103 that can be combined to reduce the number of programmable circuit elements that are programmed to implement the user design. In step 104, an algorithm combines sets of functional blocks in the user design that are located in separate logic elements or other circuit elements. Although the present invention is discussed in the context of combining functional blocks into logic elements, it should understood that the present invention also includes combining functional blocks into other circuit elements. If two or more function blocks located in two or more different logic elements are connected together according to a predefined template, it may be possible to combine these functional blocks into one logic element.

For example, the CAD system can perform a register packing algorithm 104 according to one embodiment of the present invention. Register packing algorithm 104 can combine a "naked" register and one other functional block into one logic element. Register packing algorithm 104 sorts possible combinations and implements the most desirable combinations first, as will be discussed in further detail below.

Other circuit combinations that do not include registers can also be combined according to further embodiments of the present invention. The register packing embodiment is discussed as an example of the present invention and is not intended to limit the present invention to combinations that include a register.

Register packing algorithm 104 provides a modified netlist 105 of circuit blocks. Netlist 105 includes a modified description of how the PLD will be programmed after functional blocks have been combined into fewer logic elements using the techniques of the present invention. Preferably, netlist 105 has less connections to be made with the routing resources than netlist 103.

The CAD system then programs the logic elements and other programmable circuit elements and routing resources in the PLD according to modified netlist 105 at step 106. The result of the CAD system is a PLD 107 that is configured according to the user design. Some of the functional blocks in configured PLD 107 have been combined into fewer logic elements by register packing algorithm 104.

Figure 2:
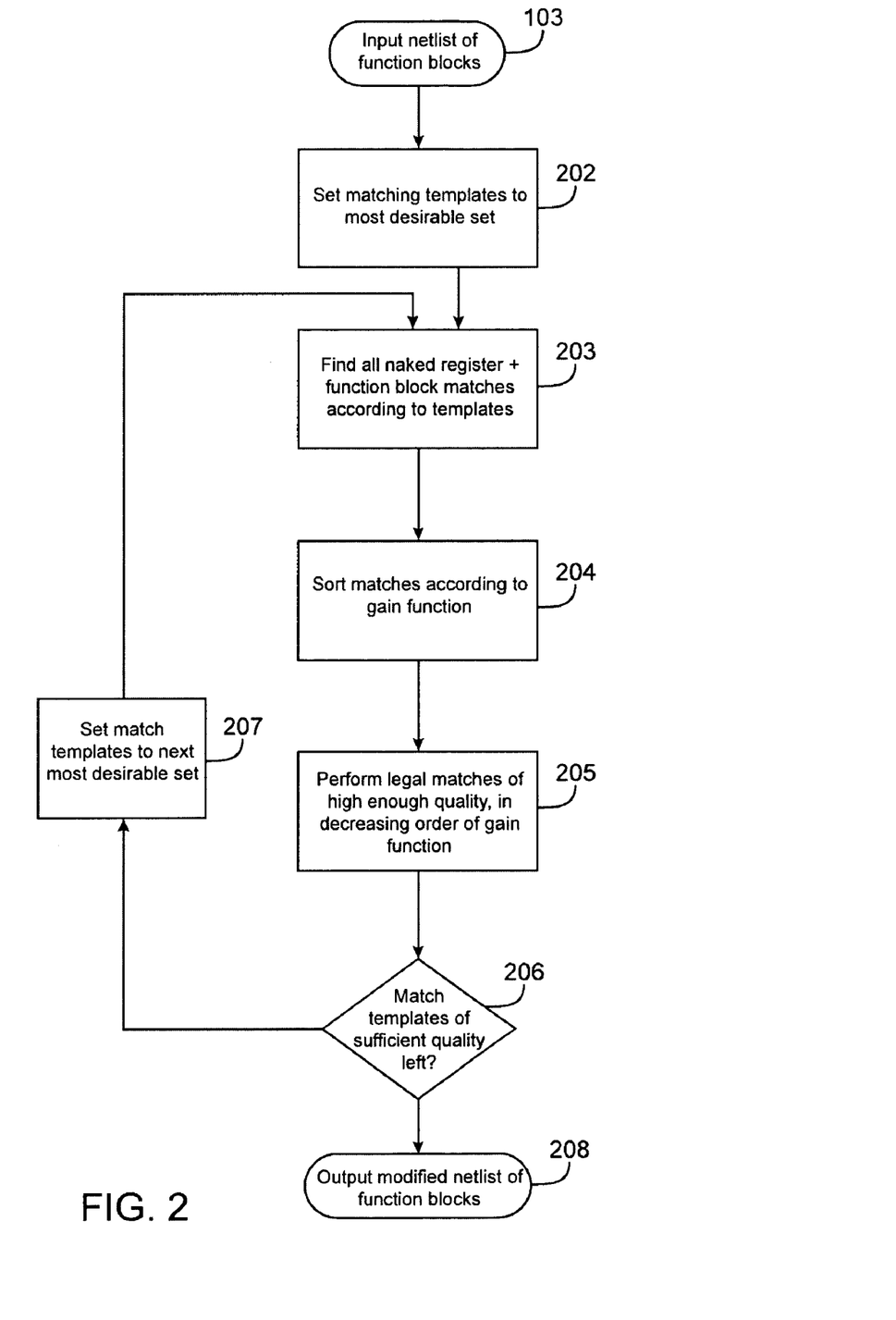
FIG. 2 is a flow chart illustrating an example of a technique for combining functional blocks into fewer programmable circuit elements according to the present invention.

FIG. 2 illustrates details of registers packing algorithm 104 according to an embodiment of the present invention. The register packing algorithm 104 accepts netlist 103 as input parameters. At step 202, the register packing algorithm selects a set of the most desirable matching templates.

Figure 3:
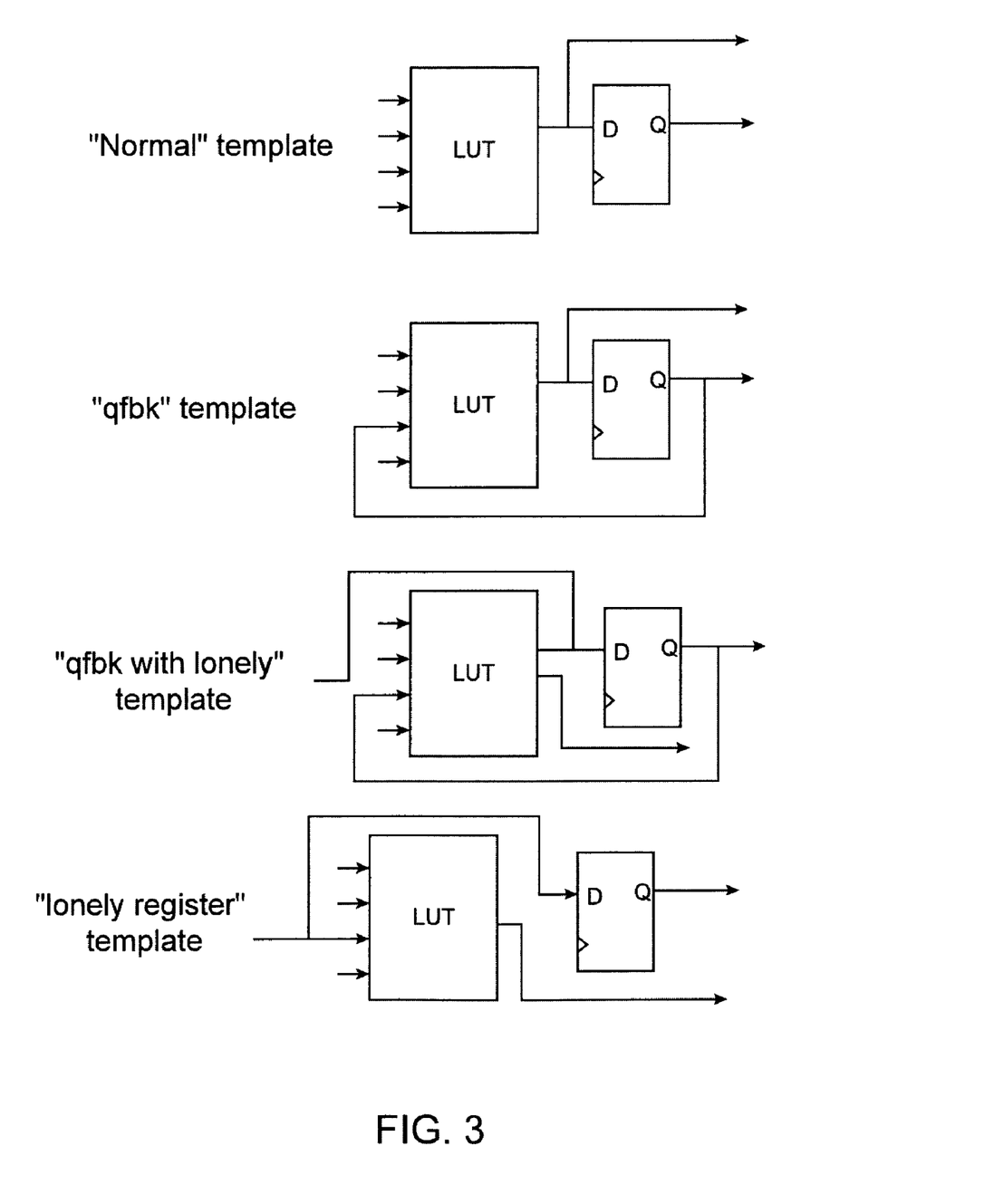
FIG. 3 illustrates examples of templates comprising functional blocks that can be combined into one programmable circuit element according to the present invention.

Desirable templates may include two or more functional blocks that can be combined into one logic element. FIG. 3 illustrates four examples of desirable templates that can be combined into one logic element according to the present invention. Each of the four templates shown in FIG. 3 includes a look-up table (LUT) and a register with a D input and a Q output.

In a normal template, the output of the LUT is coupled to the D input of the register. In a Q feedback (qfbk) template, the output of the LUT is coupled to the D input of the register, and the Q output of the register is coupled to an input of the LUT.

In a Q feedback (qfbk) with lonely template, the Q output of the register is coupled to an input of the LUT. The D input of the register is not coupled to the output of the LUT.

In a lonely register template, the D input of the register is not coupled to the output of the LUT. The LUT and the register may or may not have a common input signal. In all four templates shown in FIG. 3, the output of the LUT and the output of the register can both be outputs of a logic element.

Figure 4A:
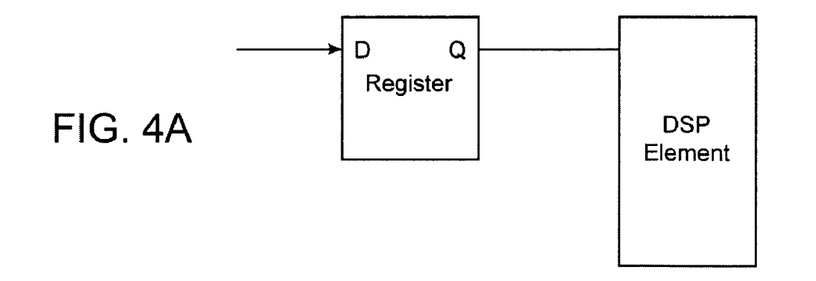
FIGS. 4A–4B illustrate examples of DSP element templates comprising functional blocks that can be combined into one programmable circuit element according to the present invention.
Figure 4B:
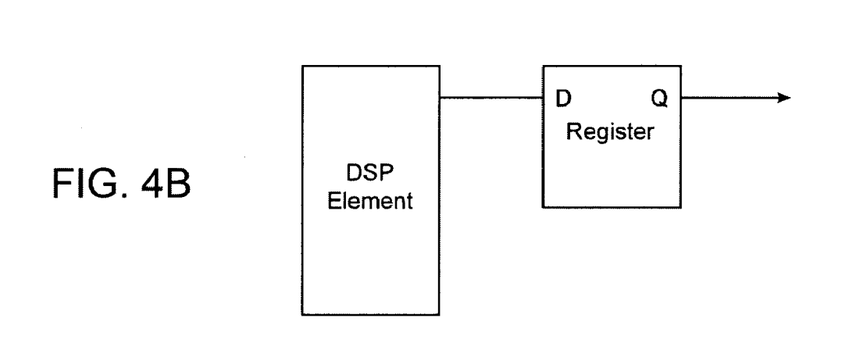

The register packing algorithm can also combine a register with other types of circuit elements. For example, a register can be combined with a DSP (Digital Signal Processing) element or a multiplier. DSP templates include a register (e.g., a flip flop) and a DSP element. In a DSP input template, the output of a register is coupled to an input of a DSP element as shown in FIG. 4A. In a DSP output template, the output of a DSP element is coupled to an input of a register as shown in FIG. 4B. According to an embodiment of the present invention, the DSP and register functional blocks in the DSP templates can be combined together into one logic element.

Figure 5A:
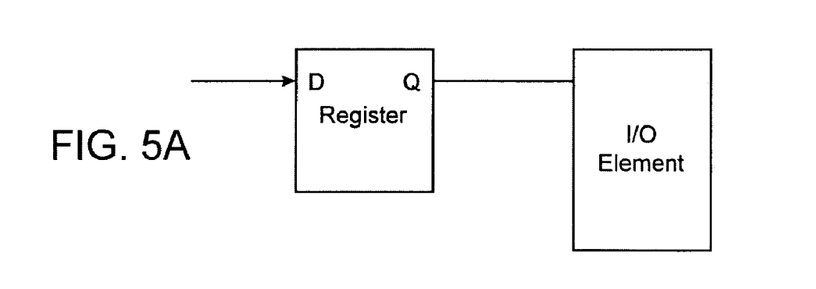
FIGS. 5A–5B illustrate examples of input/output (I/O) element templates comprising functional blocks that can be combined into one programmable circuit element according to the present invention.
Figure 5B:
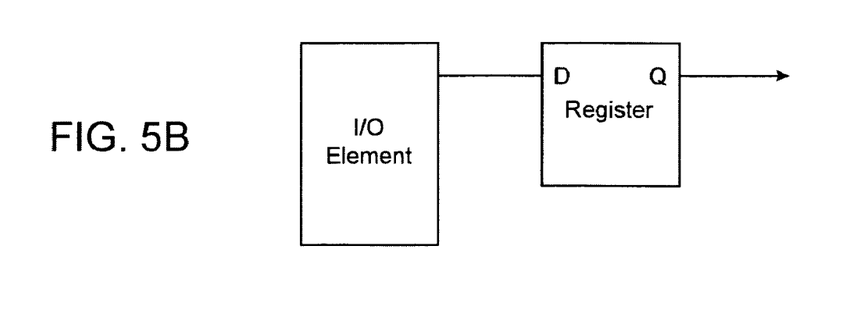

According to other embodiments of the present invention, a register can be combined with input/output (I/O) elements, memory cells such as RAM cells, DSP element scan chains, or other function blocks. FIGS. 5A–5B illustrate templates that include a register and an input/output (I/O) element such as an I/O pin or its associated circuitry. In an I/O input template, the output of a register is coupled to an input of an I/O element as shown in FIG. 5A. In an I/O output template, the output of an I/O element is coupled to an input of a register as shown in FIG. 5B. According to an embodiment of the present invention, the I/O and register functional blocks in the I/O templates can be combined together into one logic element.

Figure 6A:
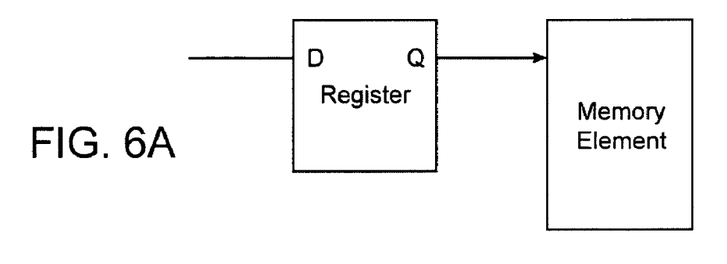
FIGS. 6A–6B illustrate examples of memory element templates comprising functional blocks that can be combined into one programmable circuit element according to the present invention.
Figure 6B:
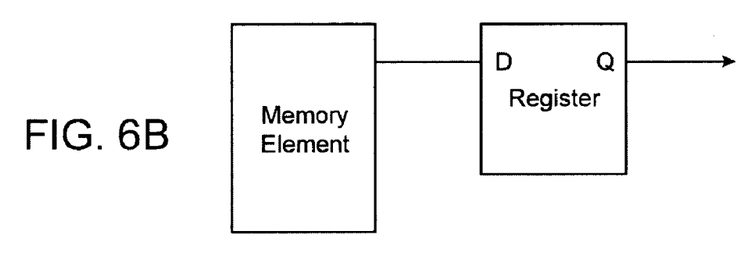

FIGS. 6A–6B illustrate templates that include a register and a memory element such as a RAM or ROM memory element. In a memory input template, the output of a register is coupled to an input of a memory element as shown in FIG. 6A. In a memory output template, the output of a memory element is coupled to an input of a register as shown in FIG. 6B. According to an embodiment of the present invention, the memory and register functional blocks in the memory templates can be combined together into one circuit element.

According to other embodiments, memory, I/O, LUT, and DSP elements can be combined with two or more registers into one circuit element. For example, a memory element can be combined with two or more registers into one circuit element, where the output of each register feeds into separate inputs of the memory element.

According to another possible embodiment of the present invention, particular programmable integrated circuits may have constraints that regulate combinations of registers with memory elements or with DSP elements (or other combinations). A constraint may require that an entire bus width of registers be combined with the DSP element or the memory element into the same logic element. For example, one of the data bus inputs to a DSP element can be 9 bits wide. The 9 registers that feed each of the 9 bits of that bus are combined with the DSP element into one circuit element to satisfy the constraint.

The register packing algorithm can ensure that all of the required combinations are feasible before it performs them. The combination of the entire bus width is then performed all in one operation to ensure that all the elements are combined. The only other way to satisfy the constraint is by not combining any of the registers into a circuit element with the DSP element.

In step 202, the packing algorithm selects a set of the most desirable templates that can be formed on the PLD. The most desirable templates may, for example, include one or more of the LUT templates shown in FIG. 3. The most desirable templates may also include any of the DSP templates shown in FIG. 4A or any of the other templates. Typically, the normal template is the most desirable template, the Q feedback is a less desirable template than the normal template, and the lonely templates are considered even less desirable. DSP input and DSP output templates are also highly desirable.

In step 203, the packing algorithm locates all of the "naked" registers specified in the netlist 103 layout of the user design. A naked register is a functional block that only includes a register. A naked register may appear explicitly as a stand alone register in netlist 103. Alternatively, a naked register may be a logic element that only uses its register, and not its look-up table or other circuitry in the logic element.

The packing algorithm then identifies all functional blocks in netlist 103 that match the most desirable templates selected in step 202. These functional blocks include a naked register and another functional block that are coupled together according to one of the most desirable templates. For example, a naked register and a LUT in separate logic elements match the normal template shown in FIG. 3 if the output of the LUT is coupled to the D input of the register.

In step 204, the packing algorithm sorts the functional blocks matched in step 203 according to a gain function. Combining the matched functional blocks into one logic element affects the speed of the user configured PLD circuit.

The gain function is an equation that determines which of the functional block combinations are the most desirable. In an embodiment of the present invention, the gain function ranks the criticality of functional block combinations. Critically is a measure of which combinations will increase the speed of the configured PLD circuit the most. Alternatively, the gain function can determine which of the functional block combinations will decrease the speed of the configured PLD circuit the least.

The criticality is dependent upon the slack $S_C$ associated with a connection. A connection is a single link between two circuit elements. The slack $S_C$ associated with a connection represents the maximum amount of time delay that can be added to a connection, while maintaining operability of the circuit design. The operability of a connection is determined according to the user requirements of the particular user design.

The slack $S_C$ is used to calculate the slack ratio. The slack ratio is the slack $S_C$ associated with a connection divided by time $T_R$. A slack ratio associated with a connection is shown by equation (1).

$$\text{Slack Ratio} = \frac{S_c}{T_R} \quad (1)$$

Time $T_R$ represents the time required to get the results of an operation in a path of connections (i.e., a plurality of connections linked together). The path of connections includes the particular connection associated with the slack $S_C$. The time required $T_R$ to get the results of the operation is specified in the user design.

The criticality $C_C$ of a connection can be computed from the slack ratio associated with a connection using equation (2).

$$C_C = 1 - \text{Slack Ratio}(c) \quad (2)$$

The criticality $C_C$ of a connection indicates the significance of the timing delay associated with the connection. For example, a connection that has a small slack ratio has a high criticality. Conversely, a connection that has a large slack ratio has a low criticality.

A high criticality indicates that only a small amount of extra delay can be added to a connection relative to the delay associated with a path that includes that connection. These connections are the time critical. A low criticality indicates that a large amount of extra delay can be added to a connection relative to the delay associated with a path that includes that connection.

The packing algorithm computes a gain value G using a gain function for each possible combination of functional blocks. The gain G can be calculated for a possible combination of functional blocks using equation (3).

$$G = \alpha C_C + \beta N_A + \gamma F \quad (3)$$

The variable $C_C$ represents the criticality of the connection between the two functional blocks (e.g., a register and a LUT) that can be combined together into one logic element. If there are two or more connections between the two functional blocks, the criticality $C_C$ may be based upon the smallest value of the maximum time delays (i.e., the smallest slack) that can be added to the connections. If there is no connection between the two functional blocks (e.g., as in lonely register template), the criticality $C_C$ is zero.

The gain function also varies based on the number of nets $N_A$ that will be removed from netlist 103 as a result of a proposed functional block combination. A net (or network) includes the connections from one terminal to one or more other terminals.

For example, an output of a LUT may be connected to an input of register, an input of a multiplier, and an input/output pin. The net for the output of the LUT includes all three of the connections to the register, the multiplier, and the I/O pin.

The routing resources required by a user design are reduced by removing more nets from netlist 103. According to equation (3), the gain G for a possible combination of functional blocks is greater when more nets $N_A$ are removed from netlist 103.

It is desirable to absorb the connections in a net into a single circuit element. By absorbing the connections associated with a net into a circuit element, less routing resources in the PLD are needed for connections in the user design. Thus, absorbing nets into circuit elements reduces the demand on routing resources. Absorbing nets into circuit elements also tends to increase the layout density of the user design.

It is more desirable to absorb an entire net into a circuit element than just a single connection between two functional blocks. By absorbing a net (including all of the connections associated with that net) into a logic element, more routing resources are freed up than by absorbing just one connection in a multi-connection net.

The variable F in equation (3) represents a goodness factor. The goodness factor F is greater for templates that are already known to be easier to route. For example, the normal template typically has greater goodness factor F than the qfbk with lonely register template, because the normal template allows greater choice in the routing resources used to connect the logic element to other circuit elements. Alternatively, the goodness factor can embody any user defined considerations. The normal template may, for example, have goodness factor F of 1.0, and the qfbk template may have a goodness factor F of 0.8.

The gain function of the present invention can take into consideration the demand on routing resources that results from combinations of functional blocks. For example, equation (3) weights the number of nets absorbed and a goodness factor that takes into consideration templates that are easier to route. The gain function may weight combinations based on other considerations that impact routing resources. In general, functional blocks that demand less routing resources or that allow a greater choice of routing resources when combined into a single circuit element are given higher gain G values.

The terms $\alpha$, $\beta$, and $\gamma$ in equation (3) are coefficients that scale the relative importance of the three variables $C_C$, $N_A$, and F. The relative weight of the three variables $C_C$, $N_A$, and F can be adjusted by changing the values of coefficients $\alpha$, $\beta$, and $\gamma$. Example values for the coefficients are $\alpha=0.7$, $\beta=0.2$, and $\gamma=0.1$.

The gain function shown in equation (3) provides higher scores for functional block combinations that have less timing delays and that use less routing resources. Functional block combinations that absorb more highly time critical connections into one circuit element, that remove more nets from netlist 103, and that are known to use a relatively small amount of routing resources have a higher gain G.

In step 204, the register packing algorithm sorts the possible functional block combinations identified in step 203 according to their gain values G. The possible functional block combinations are sorted into a list from highest gain value to lowest gain value in descending order.

Equation (3) is merely one example of a gain function that can be used in the present invention. Other gain functions may also be used. For example, any one or two of the three terms in equation (3) can be eliminated. Also, other variables can be added to equation (3) and different relationships between the variables can be used. Equations different than equation (2) can also be used to determine the timing criticality of connections.

The register packing algorithm selects the functional block combination with the highest gain G from the sorted list. The register packing algorithm then determines whether the combination between the functional blocks is feasible. A combination is feasible if it does not violate any electrical rules or any user-specified constraints.

For example, a user constraint may require that functional block A be placed on the right half of the integrated circuit and that functional block B be placed on the left half of the integrated circuit. Therefore, functional blocks A and B cannot be combined without violating this user specified constraint.

An electrical rule may also prevent some combinations of functional blocks. As an example, a combination of certain functional blocks may cause a larger structure (e.g., a logic array block) to violate an electrical rule. Also, a group of combinations may have to be all made or none made due to electrical rules on buses (e.g. merging registers with DSP blocks).

If the combination is feasible according to the electrical rules and user constraints, the register packing algorithm combines the functional blocks into one circuit element in step 205. The packing algorithm repeats 205 for the next functional block combinations in the sorted list in decreasing order of gain G.

Thus, the packing algorithm attempts to combine the functional block combinations with the highest gain values G first. In step 205, the packing algorithm performs each combination in descending order of gain if the combination is feasible, until all of the combinations in the sorted list have been considered. If a combination cannot be performed, it is taken off the sorted list. In step 205, the algorithm may choose not to perform combinations with sufficiently low gain values if, for example, the combinations are expected to reduce circuit speed.

At step 206, the packing algorithm determines if there are any more templates left that have not yet been considered. These additional templates can be matched to further reduce the number of circuit elements and amount of routing resources that are required to implement the user design. However, these additional templates may reduce the speed of the user configured PLD, or may increase the routing resources used in the user configured PLD.

At step 206, the packing algorithm only considers matching additional templates if the additional templates are sufficiently desirable. The packing algorithm determines whether a template is sufficiently desirable by comparing the user requirements to the negative impacts on speed and routing resources that would be caused by the combinations.

Alternatively, a user may specifically request that certain less desirable matching templates be combined (or not combined) in a particular user design. The packing algorithm would automatically select any user requested templates at step 206.

There are several types of less desirable templates that can be combined. One type of less desirable template that can be combined is the shared input lonely register template. The shared input lonely register template includes a LUT and a register. The LUT and the register have a shared input signal.

An example of a lonely register template is shown at the bottom of FIG. 3. In the shared input lonely register template, the dotted line indicates that the shared input signal is connected to the LUT. The gain function for shared input lonely register combinations is constant.

Figure 7:
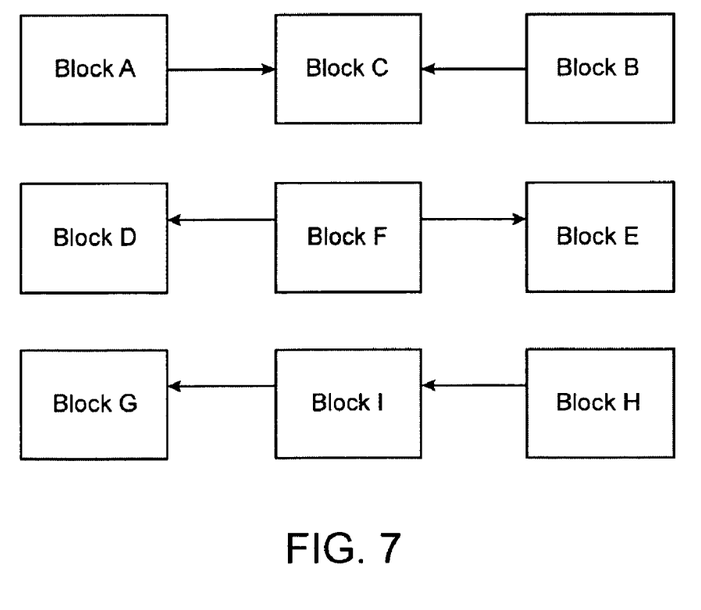
FIG. 7 illustrates examples of sibling templates comprising functional blocks that can be combined into one programmable circuit element according to the present invention.

Other less desirable templates that can be combined include "sibling" templates. FIG. 7 illustrates three examples of sibling templates. Blocks A and B both have outputs that are coupled to inputs of block C. Blocks A and B are siblings in a first type of sibling template. Block F has outputs that are coupled to inputs of blocks D and E. Blocks D and E are siblings in a second type of sibling template. Block H has an output coupled to an input of block I, and block I has an output coupled to an input of block G. Blocks H and G are siblings in a third type of sibling template. Blocks A–I can be any type of functional blocks such as registers, I/O blocks, arithmetic blocks, look-up tables, memory cells, etc.

An example of one sibling template includes a LUT and a register. The LUT and the register have no shared inputs and no source-sink connections between them. But, both the LUT and the register have a connection to the same function block. A source-sink connection is a connection between an output of one functional block and an input of another functional block.

Other less desirable templates that can be combined are the remaining lonely register templates. These lonely register templates do not have shared input signals between the LUT and the register. FIG. 3 illustrates a lonely register template. The remaining lonely register templates do not have the shared input signal represented by the dotted line coupled to the third input of the LUT in FIG. 3.

The gain function used for the remaining lonely register templates can be modified slightly. The modified gain function can take into account the design hierarchy names associated with naked registers and LUTs.

A user design can be built by combining previously designed smaller circuits, which are often called sub-circuits or sub-designs. Basic building blocks can be combined to achieve larger, more complex, circuits. Each of these larger circuits can then be considered a sub-circuit, and combined to create a still more complex circuit. For example, a LUT can be a basic building block. As another example, a register can be a basic building block.

Each of the building blocks in a completed circuit has a unique design hierarchy name. The design hierarchy names indicates the manner in which sub-circuits that include building blocks were combined to create the complete circuit.

The modified gain function for the remaining lonely register templates can result in a higher gain G for combinations between naked registers and logic elements that have similar design hierarchy names. For example, if design hierarchy names indicate that a naked register and a logic element were grouped together into a fairly small sub-circuit that was then grouped with other sub-circuits to form the complete design, the gain G is higher than it would be if the register and logic element instead came from two different sub-circuits that were combined only at the last stage of completing the circuit.

Figure 8:
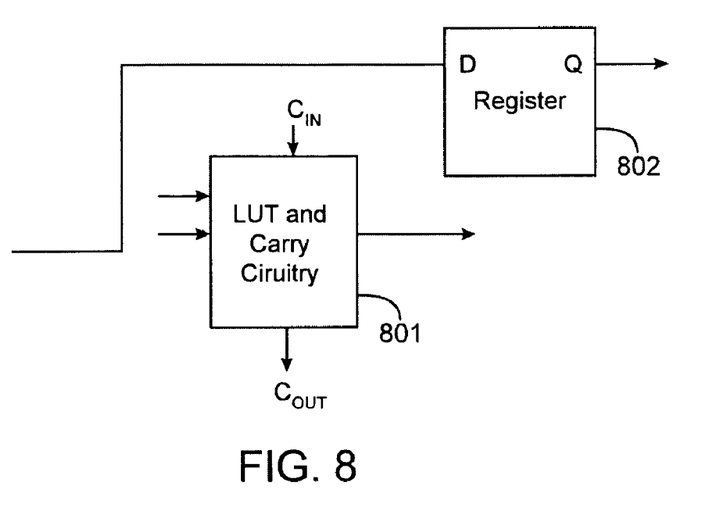
FIG. 8 illustrates an example of an arithmetic template comprising functional blocks that can be combined into one programmable circuit element according to the present invention.

Another less desirable template which can be combined is the arithmetic logic element plus a lonely register template. An example of this template is shown in FIG. 8. This template combines a register 802 with a look-up table and carry circuitry 801. Look-up table and carry circuitry 801 can perform an arithmetic function such as addition. Register 802 may have no connection to the logic element using the carry circuitry (as shown in FIG. 8).

Alternatively, the output of register 802 may be connected to one of the inputs of the logic element. This template is less desirable than some other lonely register templates, because logic elements that use carry circuitry have more constraints concerning where they can be placed in the PLD relative to the logic elements that feed their carry-in input $C_{IN}$ and are fed by their carry-out output $C_{OUT}$. Because the placement choices for these logic elements are fewer, combining a register with a logic element that uses carry circuitry can hurt the routability and timing of the circuit.

The gain function for arithmetic logic plus lonely register templates can be computed in several ways. The gain function can take into account whether a source-sink connection between the register and the logic element using its carry circuitry exists. A higher gain is given where such a connection exists.

For matchings that do not have such a source-sink connection, the similarity of the design hierarchy names of the two functional blocks can be used to compute a gain. Functional block matching in which the two blocks have longer initial portions of their design hierarchy names in common have higher gains. For example, the gain for matching two blocks named big_chip|mult|a and big_chip|mult|b would be higher than the gain for matching two blocks named big_chip|sub|c and big_chip|divide|d. This is because the first two matching functional blocks have the first two portions of their design hierarchy names in common, while the second matching functional blocks have only the first portion of their design hierarchy names in common.

The gain function can also take into consideration whether the arithmetic block and the register to be combined are siblings as shown in FIG. 7. Blocks that are siblings have higher gain G.

Figure 9:
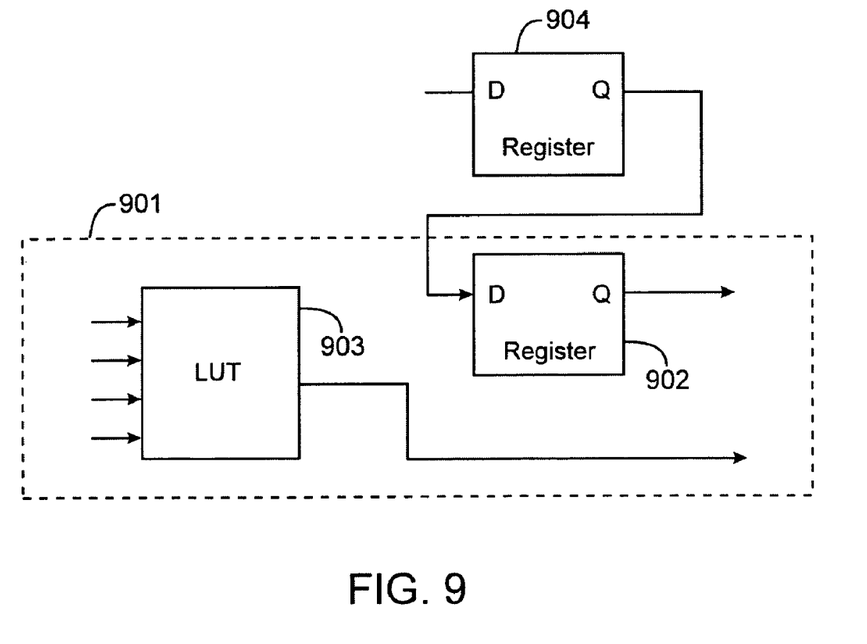
FIG. 9 illustrates an example of a cascade register chain template comprising functional blocks that can be combined into one programmable circuit element according to the present invention.

Another less-desirable template is the LUT and register cascade template shown in FIG. 9. In this template a LUT 903 is combined with a register 902 into a logic element 901. Register 902 has no output to input connections with LUT 903. Register 902 receives its D input from the output of another register 904 via a special "register cascade" input. This template is less desirable because register 904 must be placed immediately above register 902. This limits the freedom of the CAD tools to optimize the circuit placement, and can hurt timing and routability.

The combinations possible with the LUT and register cascade template can be sorted according to a gain function. As an example, that gain function can be computed as discussed above with respect to the arithmetic logic plus lonely register templates. The gain function can give higher gain values G for combinations that use less routing resources.

Because register 902 receives its input via this special connection, LUT 903 can use more of the regular function block inputs. For example, in some PLD architectures, the LUT and register cascade template allows the LUT to use four of its inputs. On the other hand, the lonely register template with no shared input between the LUT and register (FIG. 3) allows the LUT to use only 3 of its inputs.

If additional templates are determined to be sufficiently desirable at step 206, the packing algorithm sets the match templates to the next most desirable set of templates in step 207. The packing algorithm then repeats steps 203–205 for the next most desirable set of match templates.

At step 206, the packing algorithm determines if there are any more match templates that are worth performing. If more templates remain that are sufficiently desirable, the packing algorithm sets the match templates the next most desirable set of templates in step 207 and then repeats steps 203–205. This process repeats until the packing algorithm has considered all of the desirable templates.

One example of how the register packing algorithm may sort templates in terms of desirability at steps 202 and 206 is now provided. The register packing algorithm can select templates in the following list, which is sorted in terms of decreasing desirability: 1) the I/O plus registers templates, both types shown in FIGS. 5A–5B; 2) the normal template, the qfbk with lonely register template, and both types of DSP plus a register templates shown in FIGS. 4A–4B; 3) the shared input lonely register template, the sibling matches of lonely register templates, and other lonely register templates (if requested by the user); and 4) the lonely register plus arithmetic LUT template shown in FIG. 8, and the register cascade plus LUT template shown in FIG. 9 (if requested by the user).

The register algorithm may, for example, select template 1 or templates 1 and 2 in the first iteration of steps 202–205. The register packing algorithm may then select template 2, template 3, or templates 2 and 3 in the next iteration of steps 206–207 and 203–205.

When no more desirable match templates remain, the packing algorithm outputs a modified netlist 105 at step 208. The connections specified in modified netlist 105 are then placed and routed to configure the PLD according to the user design. The layout of the user design specified in netlist 105 uses fewer circuit elements than netlist 103. Netlist 105 may use less routing resources than netlist 103. Netlist 105 may produce a faster circuit than netlist 103. Netlist 105 may also produce a higher density circuit design or a circuit design that takes up less area on the PLD layout.

The present invention includes many other embodiments in addition to the embodiments described above. For example, in another embodiment of the present invention, netlist 103 can be pre-processed to unpack or separate some or all of the registers embedded in functional blocks and turn them into naked registers. A new unpacked netlist is the output of this register unpacking algorithm. The register packing algorithm described above is then run on the resulting unpacked netlist.

This embodiment provides more flexibility to the register packing algorithm by creating more naked registers for the algorithm to pack according to the gain function, which is designed to minimize the use of circuit elements, to increase speed, and reduce the use of routing resources.

For example, a register may be combined as a lonely register template in a first logic element with a first LUT. But, that register may be coupled to a second LUT according to the normal template. The register unpacking algorithm removes the register from the first logic element. The register packing algorithm then places that register in a second logic element with the second LUT as a normal template. By moving the placement of the register, the modified netlist may use less routing resources and may have a reduced timing delay.

In further embodiments of the present invention, the register unpack and re-pack procedure described above can be implemented after the functional blocks described in the netlist have been placed or routed in step 106. Alternatively, the register unpack and re-pack procedure can be implemented partway through the placement or routing of the functional blocks in the netlist.

The advantage of these embodiments is that more accurate timing estimates are available at step 106 in the CAD flow of FIG. 1. The disadvantage of these embodiments is that by changing the circuit netlist through register packing at such a late point, part or all of the placement and routing of the functional blocks may have to be re-run to adapt to the changed netlist. Thus, these embodiments may require extra time and resources.

While the present invention has been described herein with reference to particular embodiments thereof, a latitude of modification, various changes, and substitutions are intended in the present invention. In some instances, features of the invention can be employed without a corresponding use of other features, without departing from the scope of the invention as set forth. Therefore, many modifications may be made to adapt a particular configuration or method disclosed, without departing from the essential scope and spirit of the present invention. It is intended that the invention not be limited to the particular embodiment disclosed, but that the invention will include all embodiments and equivalents falling within the scope of the claims.

What is claimed is:

1. A method for combining functional blocks in a user design of a programmable integrated circuit, the method comprising:
    receiving a netlist that identifies programmable circuit elements that are selected to perform functional blocks in the user design;
    identifying first sets of functional blocks in the user design, wherein each first set matches a first template;
    sorting the first sets of functional blocks into a sorted order based upon timing constraints of the functional blocks; and
    combining the functional blocks in the first sets into fewer programmable circuit elements, wherein the first sets are combined in the sorted order.

2. The method of claim 1 wherein:
    identifying the first sets of functional blocks in the user design further comprises identifying a second set of functional blocks in the user design, wherein the second set matches the first template, the second set of functional blocks including more than one of the programmable circuit elements;
    sorting the first sets of functional blocks into the sorted order based upon timing constraints of the functional blocks further comprises determining a gain value for the second set of functional blocks based upon timing constraints of the functional blocks in the second set; and
    if the gain value is less than a threshold value for the second set of functional blocks, not combining the second set of the functional blocks into fewer programmable circuit elements.

3. The method of claim 1 wherein sorting the first sets of functional blocks into a sorted order further comprises:
    sorting the first sets of functional blocks into the sorted order according to which of the first sets of functional blocks demand less routing resources when combined.

4. The method of claim 1 wherein combining the functional blocks in the first sets into fewer programmable circuit elements further comprises:
    determining whether combining the functional blocks in the first sets violates a rule; and
    if the rule is not violated for a subset of the first sets, combining the functional blocks in the subset of the first sets into fewer programmable circuit elements.

5. The method of claim 1 wherein:
    identifying the first sets of functional blocks in the user design further comprises identifying second sets of functional blocks in the user design, wherein each second set matches a second template, and wherein each second set is performed by more than one programmable circuit element in the netlist;

sorting the first sets of functional blocks further comprises sorting the first sets and the second sets of functional blocks into a sorted order based upon timing constraints and routing considerations of the functional blocks; and combining the functional blocks further comprises combining the functional blocks in the first and the second sets into fewer programmable circuit elements, wherein the first sets and the second sets are combined in the sorted order.

6. The method of claim 5 wherein the second template includes functional blocks that are siblings.

7. The method of claim 1 wherein the first template is a normal template.

8. The method of claim 1 wherein the first template is a Q feedback template.

9. The method of claim 1 wherein the first template is a lonely register template.

10. The method of claim 1 wherein each of the first sets of functional blocks includes a lookup table and a register.

11. The method of claim 1 wherein each of the first sets of functional blocks includes a multiplier and a register.

12. The method of claim 1 wherein each of the first sets of functional blocks includes a register and a memory.

13. The method of claim 1 wherein each of the first sets of functional blocks includes a register and an input/output element.

14. The method of claim 1 wherein sorting the first sets of functional blocks into the sorted order further comprises:

sorting the first sets of functional blocks into the sorted order based upon quantities of nets that can be absorbed into programmable circuit elements by combining the first sets of the functional blocks.

15. The method of claim 1 further comprising:

identifying second sets of functional blocks in the user design, wherein each second set matches a second template, and wherein each second set is performed by more than one programmable circuit element in the netlist;

sorting the second sets of functional blocks into a second sorted order based upon timing constraints of the functional blocks; and combining the functional blocks in the second sets into fewer programmable circuit elements, wherein the second sets are combined in the second sorted order.

16. The method of claim 1 wherein the programmable circuit elements are logic elements on a programmable integrated circuit.

17. A method for combining functional blocks in a user design of a programmable integrated circuit, the method comprising:

identifying first sets of functional blocks in a netlist that indicates programmable circuit elements selected to perform functional blocks in the user design, wherein each first set matches a first template, and wherein each first set is performed by more than one programmable circuit element in the netlist;

sorting the first sets of functional blocks into an order according to a demand on routing resources caused by combining functional blocks in each of the first sets; and for a first subset of the first sets of functional blocks that can be combined without violating a rule, combining the functional blocks in each set of the first subset into one programmable circuit element in the sorted order.

18. The method of claim 17 wherein sorting the first sets of functional blocks into an order further comprises:

sorting the first set of functional blocks into the order based on quantities of nets that can be absorbed into programmable circuit elements by combining the first sets of functional blocks.

19. The method of claim 17 wherein:

identifying first sets of functional blocks further comprises identifying second sets of functional blocks in the netlist, wherein each second set matches a second template, and wherein each second set is performed by more than one programmable circuit element in the netlist;

sorting the first sets of functional blocks further comprises sorting the first sets and the second sets of functional blocks into the order according to a demand on routing resources caused by combining functional blocks in each of the first and the second sets; and combining the functional blocks further comprises, for a second subset of the second sets of functional blocks that can be combined without violating a rule, combining the functional blocks in each set of the second subset into one programmable circuit element in the order.

20. The method of claim 19 wherein combining the functional blocks further comprises:

combining the functional blocks in the first subset before combining the functional blocks in the second subset.

21. The method of claim 17 wherein the first template is a normal template.

22. The method of claim 17 wherein the first template is a Q feedback template.

23. The method of claim 17 wherein the first template is a lonely register template.

24. The method of claim 17 wherein each of the first sets of functional blocks includes a lookup table and a register.

25. The method of claim 17 wherein each of the first sets of functional blocks includes a multiplier and a register.

26. The method of claim 17 wherein each of the first sets of functional blocks includes a register and a memory.

27. The method of claim 17 wherein each of the first sets of functional blocks includes a register and an input/output template.

28. A computer system that combines functional blocks in a user design, wherein a netlist indicates programmable circuit elements selected to perform functional blocks in the user design, the computer system comprising:

code, which when executed selects N sets of functional blocks in the netlist, N being a positive integer, wherein each of the N sets matches one of a set of most desirable templates;

code, which when executed selects M sets of functional blocks in the netlist, M being a positive integer, wherein each of the M sets matches one of a set of second-most desirable templates; and code, which when executed first combines the functional blocks in the N sets into fewer programmable circuit elements according to the most desirable templates, and then combines the functional blocks in the M sets into fewer programmable circuit elements according to the second-most desirable templates.

29. The computer system of claim 28 further comprising:
code, which when executed selects P sets of functional blocks in the netlist, P being a positive integer, wherein each of the P sets matches one or more desirable templates; and
code, which when executed combines the functional blocks in the P sets into fewer programmable circuit elements according to the one or more desirable templates after functional blocks in the M sets have been combined.

30. The computer system of claim 28 further comprising:
code, which when executed sorts the N sets of functional blocks into a sorted order based upon timing constraints of these functional blocks, wherein the N sets are combined in the sorted order; and
code, which when executed sorts the M sets of functional blocks into a sorted order based upon timing constraints of these functional blocks, wherein the M sets are combined in the sorted order.

31. A method for combining functional blocks in a user design, the method comprising:
receiving a netlist that identifies programmable circuit elements that are selected to perform functional blocks in the user design;
identifying first sets of functional blocks in the user design, wherein each first set matches a first template;
sorting the first sets of functional blocks into a sorted order based upon timing constraints of the functional blocks, quantities of nets that can be absorbed into programmable circuit elements by combining the first sets of functional blocks, and a user desirability value for the first template; and
combining the functional blocks in the first sets into fewer programmable circuit elements, wherein the first sets are combined in the sorted order.

32. The method of claim 31 wherein sorting the first sets of functional blocks into the sorted order further comprises:
sorting the first sets of functional blocks into the sorted order according to design hierarchy similarities between the functional blocks in each of the first sets.

33. The method of claim 31 wherein sorting the first sets of functional blocks into the sorted order further comprises:
sorting the first sets of functional blocks into the sorted order according to sibling relationships between the functional blocks in each of the first sets as indicated in the netlist.

34. The method of claim 31 wherein sorting the first sets of functional blocks into the sorted order further comprises:
sorting the first sets of functional blocks into the sorted order based on source-sink connections between the functional blocks in each of the first sets.

35. The method of claim 31 wherein sorting the first sets of functional blocks into the sorted order further comprises:
sorting the first sets of functional blocks into the sorted order according to design hierarchy similarities between the functional blocks in each of the first sets, according to sibling relationships between the functional blocks in each of the first sets as indicated in the netlist, and based on source-sink connections between the functional blocks in each of the first sets.

* * * * *